United States Patent [19]

Ramesh

[11] Patent Number: 5,248,564
[45] Date of Patent: Sep. 28, 1993

[54] C-AXIS PEROVSKITE THIN FILMS GROWN ON SILICON DIOXIDE

[75] Inventor: Ramamoorthy Ramesh, Tinton Falls, N.J.

[73] Assignee: Bell communications Research, Inc., Livingston, N.J.

[21] Appl. No.: 988,073

[22] Filed: Dec. 9, 1992

[51] Int. Cl.$^5$ .............................................. B32B 9/00
[52] U.S. Cl. .................................... 428/688; 257/295; 361/321.1; 428/689; 428/210
[58] Field of Search ............... 428/688, 209, 210, 689, 428/690, 457, 458; 361/305, 321, 303, 305, 311; 257/295, 769

[56] References Cited

U.S. PATENT DOCUMENTS

| | | | |
|---|---|---|---|
| 5,155,573 | 10/1992 | Abe | 365/145 |
| 5,155,658 | 10/1992 | Inam | 361/321 |
| 5,164,808 | 11/1992 | Evans, Jr. | 361/321 |
| 5,168,420 | 12/1992 | Ramesh | 361/321 |

OTHER PUBLICATIONS

Grayson, Encyclopedia of Semiconductor Technology, Wiley & Sons 1984 pp. 242-243.
A. F. Wells, "Structural Inorganic Chemistry", 1975, 4th ed., Clarendon, pp. 149-154.

*Primary Examiner*—Patrick J. Ryan
*Assistant Examiner*—Patrick Jewik
*Attorney, Agent, or Firm*—Leonard Charles Suchyta; Lionel N. White

[57] ABSTRACT

A method and resulting structure for growing a crystalline perovskite film (16) on a silicon dioxide layer (12) by means of an intermediate template layer (14) of a c-axis oriented layered perovskite, such as bismuth titanate. The perovskite film can be ferroelectric lead-lanthanum zirconate titanate or conductive cubic metal oxides used as electrodes for the ferroelectric.

11 Claims, 4 Drawing Sheets

C-AXIS PEROVSKITE THIN FILMS GROWN ON SILICON DIOXIDE

FIELD OF THE INVENTION

The invention relates generally to the growth of perovskite thin films. In particular, the invention relates to the use of template layers to foster the growth of crystalline perovskite thin films on non-crystalline silicon oxide. Such thin films are particularly useful in ferroelectric devices.

BACKGROUND ART

Ferroelectrics offer the possibility of many important electronic devices, especially dense, non-volatile memories. The ferroelectric material can be electrically switched between two stable electrical polarization states. The resultant electrical field also has two states. It persists in the absence of the switching field and can be used for various purposes. The most widespread application is a non-volatile memory in which the ferroelectric fills the gap of a thin-film capacitor. Depending on the polarity of the writing pulse, the capacitor is charged to one of two voltage states of opposite polarity. Unlike semiconductor capacitive memories (dynamic random access memories or DRAMs), the ferroelectric capacitive memory is non-volatile and maintains its stored information even if depowered. Also, because of the very high effective dielectric constants of ferroelectrics, ferroelectric memories can be made very small.

Until recently, ferroelectric memories mostly relied on ferroelectric thin films between metallic electrodes. Because the ferroelectric was deposited on the polycrystalline metal, it was also polycrystalline. Its polycrystalline structure introduced substantial problems with reliability and aging because of the significant interfacial effects at the grain boundaries.

Recently, however, crystalline ferroelectric thin-film devices have been reported. In U.S. Pat. No. 5,168,420, I disclosed the growth of a crystalline ferroelectric thin film of lead zirconate titanate (PZT) on a crystalline layer of the cuprate perovskite high-temperature superconductor $YBa_2Cu_3O_{7-x}$ (YBCO), which acted as the lower electrode of the capacitor. Another YBCO layer formed the upper electrode. YBCO can be grown to have high crystalline quality with a c-axis orientation. Its a- and b-axis lattice parameters are 0.383 and 0.393 nm while its c-axis parameter is 1.168 nm, and all its axes are approximately perpendicular. Thus, a c-axis orientation produces a layered structure. I now believe that the high crystalline quality of the PZT was due to the layered perovskite on which it was grown. In U.S. Pat. No. 5,155,658, I suggested that the YBCO/PZT/YBCO structure could be grown on silicon substrates by use of an intermediate buffer layer of yttria-stabilized zirconia (YSZ). Thereby, the ferroelectric memory could be integrated with silicon support circuitry. However, YBCO is disadvantageous in that its crystalline growth requires temperatures of nearly 800° C., which is incompatible with silicon processing and, when used as the upper electrode, severely limits the choice of ferroelectrics, which tend to dissociate at those temperatures. Furthermore, the layered structure of perovskite electrodes, typical for high-temperature superconductors complicates the design.

Others have suggested that cubic metal oxide electrodes be used for ferroelectric capacitors. One such oxide is $La_{1-x}Sr_xCoO_3$, with $0 \leq x < 1$ (LSCO), which grows with almost singly crystalline quality at around 600°–650° C. Other examples are $LaCrO_3$ and $SrRuO_3$. However, these cubic metal oxides do not grow with satisfactory crystalline quality on YSZ-buffered silicon. In U.S. patent application Ser. No. 07/925,350, filed Aug. 4, 1992 and incorporated herein by reference, I disclosed that singly crystalline metal oxide can be grown on YSZ-buffered silicon by use of an intermediate template layer of a layered perovskite, such as bismuth titanate ($Bi_4Ti_3O_{12}$ or BTO). The PZT or other ferroelectric then epitaxially grows on the cubic metal oxide. Layered perovskites appear to exhibit a powerful tendency to grow with a c-axis orientation, that is, with the long axis perpendicular to the film. The crystallinity is optimized when the template layer is grown to a thickness of 20–40 nm is a temperature range of 600°–690° C., optimally around 640° C. This orientational preference appears to follow from the low surface energy of the nearly square a-b face of the layered perovskites. Furthermore, the a-b face has dimensions and crystal chemistry that are nearly identical to those of the cubic perovskite oxides. The layered perovskite can be YBCO or preferably bismuth titanate, which seems to act as an especially powerful template.

Nonetheless, depositing a buffer layer of YSZ on silicon prior to forming the ferroelectric elements is not totally satisfactory. The silicon substrate is advantageous in that silicon support circuitry, especially complementary metal-oxide-semiconductor (CMOS) circuitry, can be fabricated in it. The YSZ is deposited at a temperature around 800° C., which is incompatible with silicon CMOS processing. It would be especially advantageous if the ferroelectric elements could be grown on silicon dioxide, which is an amorphous glass. The silicon oxide would isolate the ferroelectric elements and could be used as the oxide layer in a metal-oxide-semiconductor (MOS) gate transistor associated with each ferroelectric memory cell. Unfortunately, LSCO grown directly on $SiO_2$ shows very little crystallographic orientation and appears to be polycrystalline. Also, PZT grown directly on the $SiO_2$ forms in the non-ferroelectric pyrochlore phase.

SUMMARY OF THE INVENTION

The invention may be summarized as a thin-film structure and its method of making in which a perovskite thin film is grown on a silicon oxide layer by the use of an intermediate template layer of a layered perovskite, preferably bismuth titanate. The perovskite thin film may be a cubic metal oxide acting as a lower electrode to a crystalline ferroelectric memory device, be the ferroelectric itself, or be a high-temperature superconductor.

DETAILED DESCRIPTION OF THE PREFERRED EMBODIMENT

Figure 1:
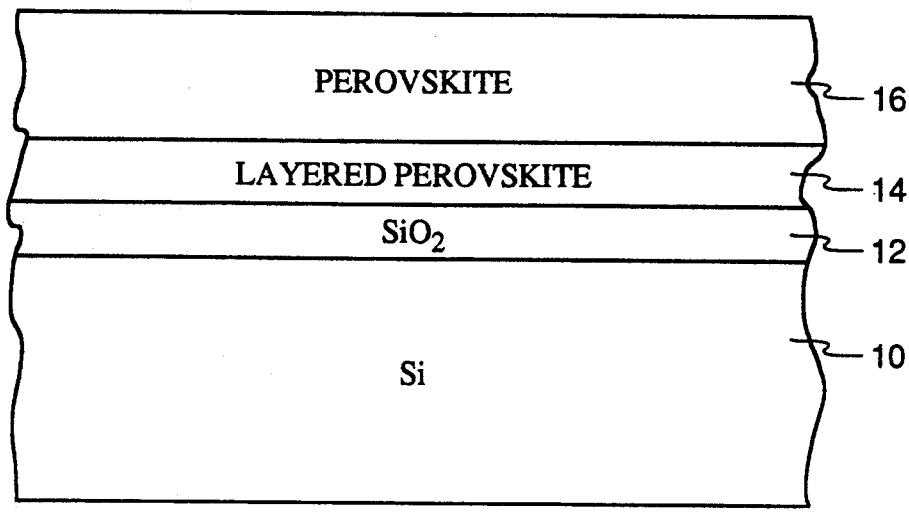
FIG. 1 is a cross-sectional illustration of a conceptual embodiment of the invention.

I have found that the layered perovskites, particularly bismuth titanate, are such powerful templates that they can be grown with very good crystallinity directly on silicon dioxide. As illustrated in cross-section in FIG. 1, a singly crystalline silicon wafer 10 has its surface oxidized to form an amorphous silicon dioxide layer 12. A thin crystalline template layer 14 of, for example, bismuth titanate is grown on the silicon dioxide layer 12 under conditions favoring c-axis orientation. Other perovskites, whether layered or cubic, can be grown as one or more epitaxial layers 16 over the template layer 14.

The perovskite crystal structure is described by A. F. Wells in the reference book *Structural Organic Chemistry*, 4th. ed, Clarendon, 1975, pp. 149-154. Following the definitions given in my U.S. patent application, Ser. No. 07/925,350, a layered perovskite is approximately rectangular with the deviation from perpendicularity being limited to about 3° but is distinctly non-cubic in that the lattice parameters differ by at least 3%. For many important layered perovskites, the a- and b-axis lattice parameters are nearly equal but the c-axis lattice parameters are more than approximately twice as large. On the other hand, many technologically important perovskites have a cubic or nearly cubic lattice structure. By nearly cubic is meant that the deviations from perpendicularity are limited to 3° and the lattice parameters are equal to within 5%.

Figure 2:
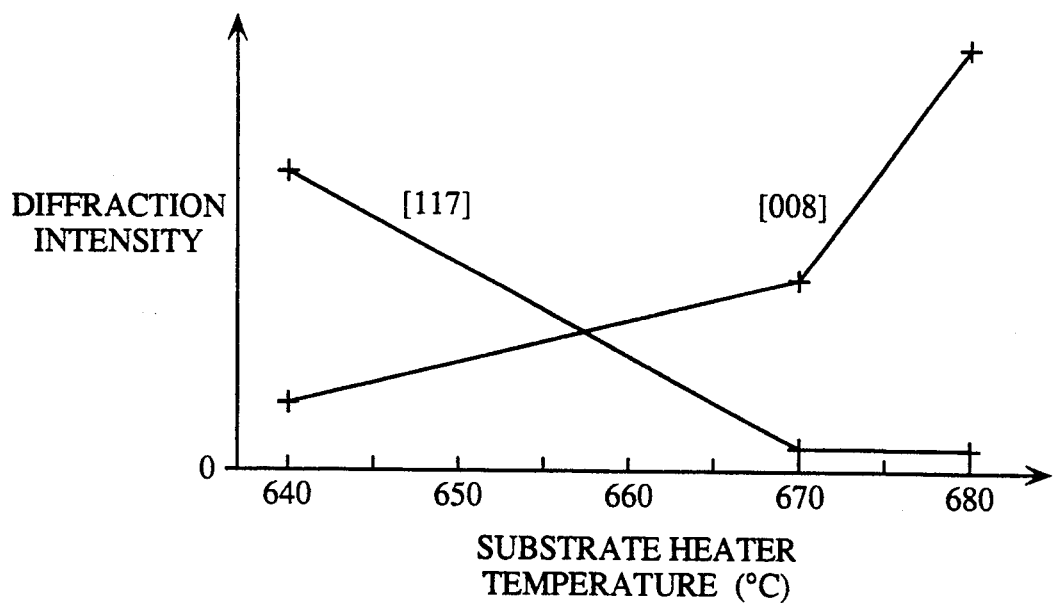
FIG. 2 is chart of x-ray diffraction data illustrating the effect of growth temperature on the crystallinity of the template layer.

The layered-perovskite template layer 14 needs to be deposited to a minimum thickness and under well controlled deposition conditions favoring growth of c-axis orientation. Pulsed laser depositions were used for all experimental samples. The equipment and general operating conditions are described in my prior patents and the references contained therein. The dependence of orientation upon deposition conditions for pulsed laser ablation is described by Inam et al. in U.S. patent application, Ser. No. 531,255, filed May 31, 1990. The temperature of the sample is controlled and monitored by the substrate heater. It is estimated that the substrate temperature is approximately 50° C. lower than the substrate heater temperature. The optimum temperature for bismuth titanate grown on silicon dioxide, as measured at the substrate heater, is about 670° C. Below this temperature, the bismuth titanate becomes increasingly polycrystalline. If the template layer is polycrystalline, then the after grown layers would be polycrystalline. Diffraction peak intensities are illustrated in FIG. 2 for both the [008] peak, indicative of c-axis orientation, and the [117] peak, indicative of polycrystallinity. At 670° C. and above, the [117] peak essentially disappears while the [008] peak progressively strengthens. At substrate heater temperatures higher than about 700° C., Bi is lost due to the sticking problem, and the crystallinity of the bismuth titanate is thereby destroyed. Hence, a range of 670°-690° C. is preferred. In the case that the epitaxial perovskite layer 16 is the ferroelectric $Pb_{1-y}La_yZr_{1-x}Ti_xO_3$ (PLZT), a minimum thickness of about 25 to 30 nm for the template layer 14 is needed to prevent the formation of the pyrochlore PLZT phase and also to prevent migration of the PLZT components through the template layer. When a 300 nm PLZT layer was grown at 640° C. on a 20 nm bismuth titanate layer which had been grown at 670° C., the [00L] perovskite peaks for the PLZT were very weak while a strong pyrochlore peak was observed. On the other hand, only very intense [00L] peaks were observed for the PLZT when the thickness of the bismuth titanate was increased to 35 or 40 nm. It is believed that the thicker template layer prevents the diffusion of lead through the template layer and the resultant loss of stoichiometry and phase purity in the PLZT.

EXAMPLE

Figure 3:
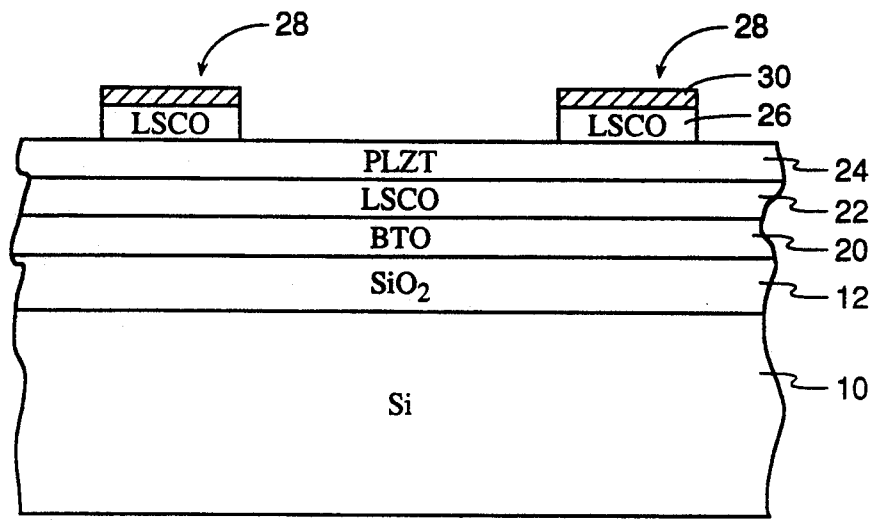
FIG. 3 is a cross-sectional view of an experiment embodiment of the invention.

A series of experimental structures, illustrated in cross-section in FIG. 3, were fabricated mostly following the procedures described in my U.S. patent application, Ser. No. 07/925,350. A (001)-silicon wafer 10 was thermally wet oxidized to form a $SiO_2$ layer 12 having a thickness of about 100 nm. A template layer 20 of $Bi_4Ti_3O_{12}$ was deposited by pulsed laser deposition at 670°-675° C., which is within the optimum temperature range. Various template thicknesses were used within the range of 30 to 80 nm. A capacitive heterostructure was then grown on the template layer 20 at a constant temperature for the substrate heater in the range 600°-640° C. The heterostructure consisted of a lower electrode layer 22 of the cubic perovskite LSCO, a ferroelectric layer 24 of PLZT, and an upper electrode layer 26 of LSCO. The LSCO had a composition of $La_{0.5}Sr_{0.5}CoO_3$ and thicknesses of 100 nm, and the PLZT had a composition of $Pb_{0.9}La_{0.1}Zr_{0.2}Ti_{0.8}O_3$ and a thickness of 300 nm.

Prior to further definition, the structure was examined with x-ray diffraction. Very strong [00L] peaks were observed from both the LSCO and the PLZT. No [110] peaks, indicative of polycrystallinity, were observed. X-ray rocking curves about the PLZT [001] peak showed typical widths of 1.5°-2°.

The structure was then photolithographically defined into an array of capacitor dots 28, each having a metallization layer 30. One large capacitor dot served as a ground for the other smaller dots 28.

The capacitors exhibited distinct hysteresis curves at applied voltages of 3 V. The switched polarization was typically in the range of 12-18 $\mu C/cm^2$, more than sufficient for memory applications. More important properties are those related to the reliability of the capacitors, that is, fatigue, aging, and retention. Capacitors were subjected to a bipolar fatigue experiment by cycling voltage between ±3 V at 100 kHz. The difference between the switched and the unswitched remanent polarization was measured after various number of cycles. There was very little fatigue after $10^{10}$ cycles. Logic state retention was measured on a capacitor that had already been fatigued. The remanent polarization for the two logic states remained separated by 5-7 $\mu C/cm^2$ for retention times covering the range $10^{-1}$-$10^5$ secs.

Another set of experiments tested the ability of the capacitor to be switched after being held in a particular polarization state for a certain time. This attribute, called aging or imprinting, is critical if the memory is to be used for long term storage. The capacitor was first written with a −3 V, 8.6 $\mu s$ write pulse and then left in that state for a certain time. At the end of the time, the capacitor was read with a series of read pulses having the sequence +2.5 V, +2.5 V, −2.5 V, and −2.5 V. If any preference had been manifested for a particular polarization state, then the polarization measured in the positive and negative directions would not have been the same. The pulsing sequence tested the switched and unswitched polarizations in both directions. The data showed that the switched or unswitched polarizations in the two directions were approximately the same and that the difference between the switched and unswitched polarizations remained constant after aging over a range from $10^{-1}$–$10^5$ sec.

The deposition of the template layer directly onto the silicon oxide has several advantages over the previously disclosed YSZ buffer layer. The temperature of the substrate heater for YSZ deposition is quite high, viz., in the range of 750°–800° C. Such temperatures would cause the interdiffusion of dopants for implanted wafers. On the other hand, as demonstrated above, the growth of the bismuth titanate template can be limited to temperatures below 700° C., and even these temperatures need to be maintained only for the growth of a thin layer. Also, the $Si/SiO_2$ interface exhibits much better electronic properties than the Si/YSZ interface. When bismuth titanate layers were grown to thickness greater than 25 nm, C-V measurements showed no evidence for charge trapping or injection at the interface. Finally, since the silicon oxide layer is grown prior to the fabrication of the ferroelectric cell, either the silicon circuit can be fabricated first, or the crucial $Si/SiO_2$ interface can be formed prior to the ferroelectric processing so that the subsequent silicon processing requires only selective photolithography of the silicon oxide. The crystalline ferroelectrics offer great advantages over the polycrystalline ferroelectrics produced when platinum electrodes are used. Grain-boundary diffusion is very small if it exists at all. Fatigue is significantly reduced. And the oxide composition of all the memory cell layers eliminates problems of oxidative changes in surfaces when the structures are exposed to air.

Figure 4:
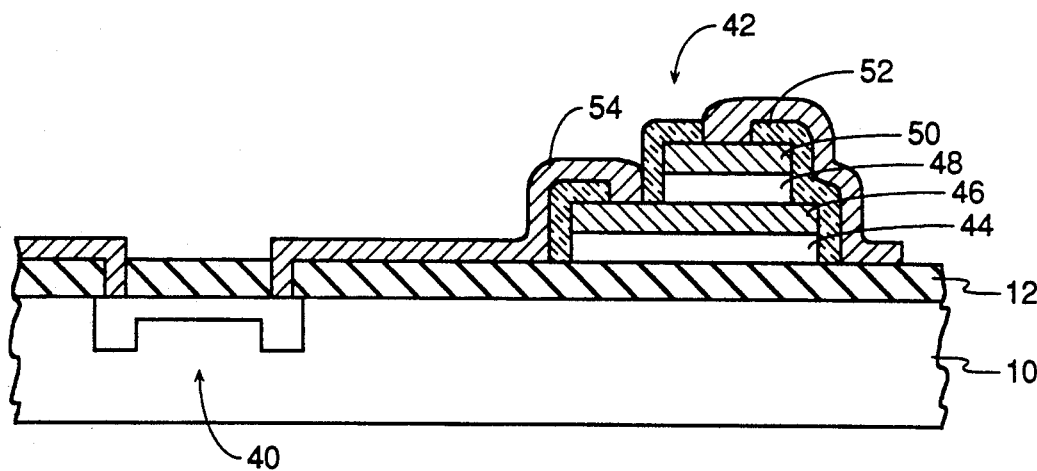
FIG. 4 is a cross-sectional view of a ferroelectric capacitive memory cell of the invention including an associated pass gate.

A preferred structure for a ferroelectric random access memory (FRAM) cell is illustrated in cross section in FIG. 4. A large array of such cells would be integrated on a single silicon integrated circuit substrate 10 together with associated silicon support circuitry. The substrate 10 is first processed to fabricate a silicon CMOS pass-gate transistor 40 associated with each FRAM cell as well as to fabricate the other silicon circuitry. The memory cell is connected to the drain of the pass-gate transistor 40 which determines whether the cell is connected to the word line and which in turn is controlled by a bit line. A silicon dioxide layer 12 is deposited over the transistor 40 to serve either as a field oxide or a gate oxide. A ferroelectric capacitor 42 is then grown and defined. It consists of a bismuth titanate template layer 44, a lower electrode layer 46 of a conductive cubic metal oxide, a ferroelectric layer 48, and an upper electrode layer 50 of the same cubic metal oxide. Glass 52 is reflowed over the structure and via holes are etched through the glass 52 and the silicon dioxide layer 12 overlying the transistor 40 so that metal leads 54 interconnect the ferroelectric capacitor 42 and its pass gate 40 and provide further electrical connections to other circuitry.

Figure 5:
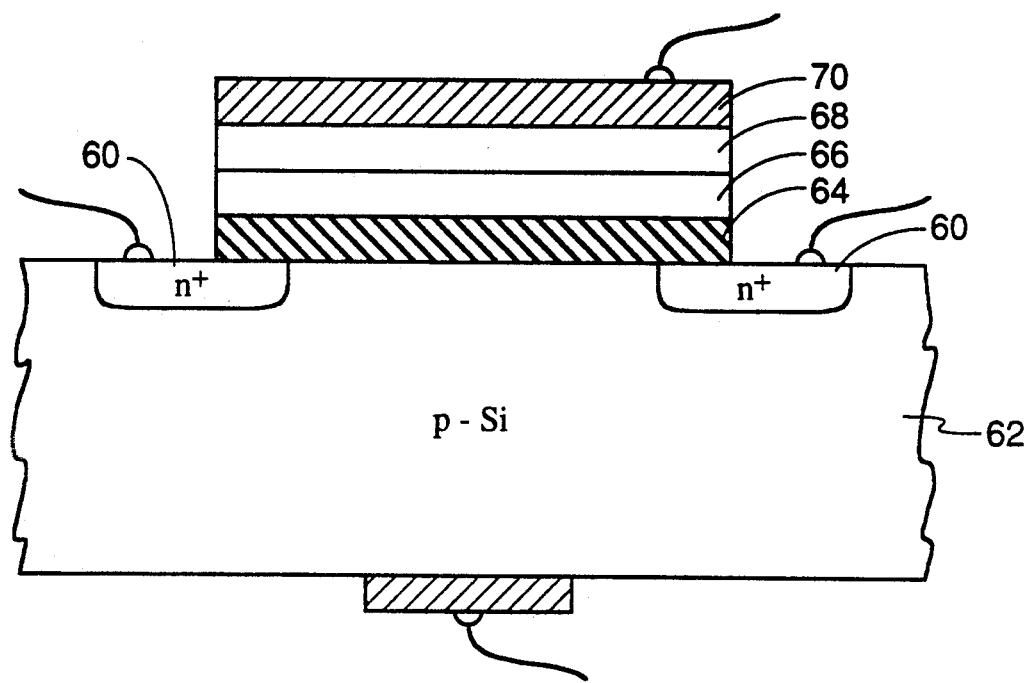
FIG. 5 is a cross-sectional view of a ferroelectric memory field-effect transistor of the invention.

A related device is a ferroelectric memory field-effect transistor (FEMFET) illustrated in cross-section in FIG. 5. Heavily doped source and drain regions 60 are formed in the surface of a silicon region 62 of the opposite conductivity type, where the silicon region 62 can be an epi-layer. A silicon dioxide gate layer 64 is deposited over the silicon 62 between the source and drain regions 60. A bismuth titanate template layer 66 is deposited over the silicon dioxide 64 with a c-axis orientation so as to force an after grown ferroelectric layer 68 to grow epitaxially with a c-axis orientation. An upper electrode layer 70 may be a polycrystalline metal or a conductive crystalline oxide. Bipolar voltage applied to the electrode layer 70 with respect to the silicon region 62 causes the ferroelectric 48 to switch between two stable polarization states which respectively open or shut off the conduction channel between the source and drain regions 60. The result is either a non-volatile gate for current passing between the source and drain regions 60 or a non-volatile memory probed through the source and drain regions 60.

My U.S. patent application, Ser. No. 07/925,350 described a number of important electronic devices utilizing a crystalline perovskite active layer. The present invention allows these devices to be fabricated without the YSZ buffer layer. Some additional devices are described below.

Figure 6:
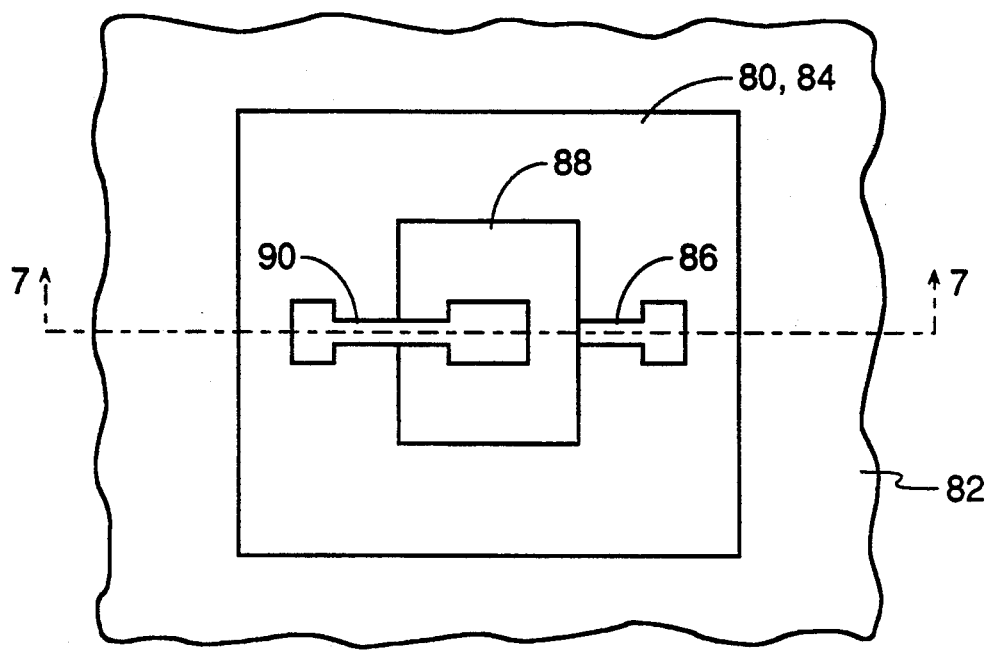
FIG. 6 is a plan view of a piezoelectric mechanical oscillator of the invention.
Figure 7:
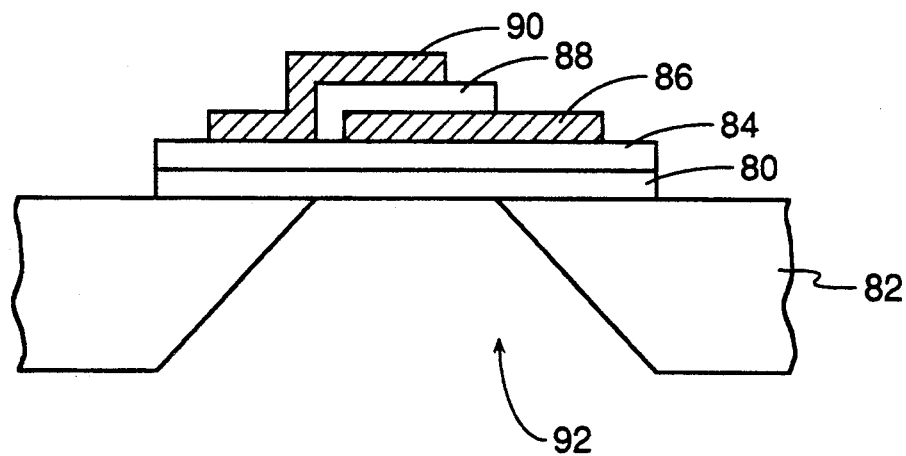
FIG. 7 is a cross-sectional view of the oscillator of FIG. 6 taken along the sectional line 7—7.

An electrically controlled mechanical oscillator is shown in top plan view in FIG. 6 and in cross section in FIG. 7. Such an oscillator is usable as the tuning element in a microwave filter or resonator. A silicon dioxide layer 80 is deposited on a silicon substrate 82, a c-axis oriented bismuth titanate template layer 84 is deposited over it, and both layers 80 and 84 are defined. A capacitor-like DC transducer is then fabricated. It consists of a lower electrode 86 of a cubic metal oxide, a piezoelectric layer 88 of PLZT, for example, and an upper electrode 90, all of which are crystalline. Then, the substrate is etched on its back to form an aperture 92 exposing the back of the silicon dioxide layer 80. The cantilevered transducer structure has a resonant mechanical frequency that depends upon, among other things, the thickness of the piezoelectric layer 88. The voltage applied between the electrodes 84 and 88 controls the piezoelectric thickness and thus the resonant frequency. If the piezoelectric material is also ferroelectric, which is the case for PLZT, then the oscillator can be switched to selected frequencies.

Ferromagnetic spinel ferrites are useful for magnetic recording. Spinel ferrites have a typical composition of $AB_2O_4$ with lattice parameters along the long axis in the range of 0.8–0.83 nm. The oxygen sub-lattice is essentially the same as that of the perovskites, and the fundamental unit cell contains two units of the oxygen sub-lattice, hence the large c-axis lattice parameter. Spinels such as $Mn_xZn_{1-x}Fe_2O_4$ are used for magnetic recording heads while $\gamma$-$Fe_2O_3$ is used as a recording media. Such spinel materials can be easily and economically grown as oriented crystals using the layered perovskite template layer of the invention.

Many of the high-$T_c$ superconductors, such as YBCO, BiSrCaCuO, and LaSrCuO have a layered perovskite crystal structure. These materials may be grown on silica by use of an intermediate template layer of bismuth titanate.

Although the examples above have all used bismuth titanate as the template layer, the results presented in my U.S. patent application, Ser. No. 07/925,350 indicate that other layered perovskites should exhibit a templating effect. However, the templating material must be chosen such that it does not chemically interact and mix with the silica on which it is grown, thereby defeating the desired non-epitaxial but crystalline growth of the templating material over the amorphous silica. Experiments have shown that YBCO cannot be used as a templating material over $SiO_2$ because the Ba reacts with the silica to form barium silicate. Similarly, Pb-based layered perovskites cannot be used as a template layer since a liquid lead silicate phase readily forms nor can the BiSrCaCuO or LaSrCuO superconductors be used because the Sr reacts with silica. As a general rule, the templating layered perovskite must not contain any cation the silicate of which more readily forms (has a higher absolute value of free energy) than the templating perovskite. In this respect, bismuth titanate is rather unique since both its cations, Bi and Ti do not form silicates as readily as do the alkali and alkaline-earth elements. Bismuth tungstate $Bi_2WO_6$ is another layered perovskite which should satisfy this condition.

The invention can be used with deposition methods other than pulsed laser ablation, such as the various forms of chemical vapor deposition and sputtering.

It is understood that although the layered perovskite template causes after grown layers to have a highly oriented c-axis, the orientation of the a-and b-axes is likely to have a polycrystalline distribution. That is, both the layered perovskite template and the after grown layers are crystallographically oriented in one dimension but are not singly crystalline over large areas. The differential crystallinity arises because the layered perovskite exhibits a strong tendency to grow with its c-axis normal to the growth plane, but there is no corresponding mechanism for long-range alignment of the a- and b-axes when the layered perovskite is grown on an amorphous or even polycrystalline substrate. This type of differential polycrystallinity contrasts with the random distribution of all axes over three dimensions found in amorphous materials and truly polycrystalline materials, which may be used as substrates with the invention.

The invention thus allows the integration of conventional silicon-based electronics, such as CMOS technology, with the oxide perovskites. The silicon-based electronics utilizes the excellent electronic properties of the $SiO_2$/Si interface while the oxide perovskites provide a wide range of other physical properties. In particular, the template-growth approach enables the marriage of highly crystalline ferroelectric thin-films with silicon drive electronics.

What is claimed is:

1. A perovskite thin-film structure comprising:
   a substrate having a surface comprising silicon oxide;
   a substantially c-axis oriented template layer comprising a layered perovskite formed directly on said silicon oxide; and
   at least one perovskite layer formed crystallographically c-axis oriented sequentially over said template layer.

2. A perovskite thin-film structure as recited in claim 1, wherein said layered perovskite comprises bismuth titanate.

3. A perovskite thin-film structure as recited in claim 1, wherein said layered perovskite comprises bismuth tungstate.

4. A perovskite thin-film structure as recited in claim 1, wherein said layered perovskite consists essentially of a chemical compound preferentially forming as said perovskite rather than as a silicate.

5. A perovskite thin-film structure as recited in claim 1, wherein said at least one crystallographically oriented perovskite layer comprises a ferroelectric layer.

6. A perovskite thin-film structure as recited in claim 1, wherein said at least one crystallographically oriented perovskite layer comprises two cubic metal oxide layers and an intermediate perovskite layer disposed between said metal oxide layers.

7. A perovskite thin-film structure as recited in claim 6, wherein said intermediate perovskite layer comprises a ferroelectric material.

8. A perovskite thin-film structure as recited in claim 1, wherein said substrate comprises crystalline silicon and wherein said silicon oxide comprises a film formed on said crystalline silicon.

9. A perovskite thin-film structure comprising:
   a substrate having a three-dimensionally random crystalline orientation;
   a substantially c-axis oriented template layer comprising a layered perovskite formed directly on said silicon oxide, said template layer perovskite being substantially chemically inert with respect to said substrate; and
   at least one perovskite layer formed crystallographically c-axis oriented sequentially over said template layer.

10. A structure as recited in claim 9, wherein said substrate comprises a glassy surface.

11. A structure as recited in claim 10, wherein said glassy surface comprises a silicon oxide surface.

* * * * *